(12) United States Patent
Kong et al.

(10) Patent No.: US 6,757,879 B1
(45) Date of Patent: Jun. 29, 2004

(54) SIGNAL ROUTING IN PROGRAMMABLE LOGIC DEVICES

(75) Inventors: Raymond Kong, San Francisco, CA (US); Sandor S. Kalman, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 92 days.

(21) Appl. No.: 10/268,878

(22) Filed: Oct. 9, 2002

Related U.S. Application Data

(63) Continuation of application No. 10/035,500, filed on Oct. 25, 2001, now Pat. No. 6,496,970, which is a continuation of application No. 09/916,071, filed on Jul. 26, 2001, now Pat. No. 6,480,999.

(51) Int. Cl.$^7$ .............................................. G06F 17/50
(52) U.S. Cl. .............................. 716/10; 716/13; 716/16
(58) Field of Search ........................................ 716/7–17

(56) References Cited

U.S. PATENT DOCUMENTS

| | | | |
|---|---|---|---|
| 5,553,002 A | | 9/1996 | Dangelo et al. |
| 5,648,913 A | * | 7/1997 | Bennett et al. ............... 716/16 |
| 5,696,771 A | | 12/1997 | Beausang et al. |
| 5,822,214 A | * | 10/1998 | Rostoker et al. ............... 716/10 |
| 6,308,309 B1 | * | 10/2001 | Gan et al. ....................... 716/8 |

OTHER PUBLICATIONS

XAPP404 (v1.2) Application Note entitled "Xilinx Alliance 3.1i Modular Design"; Apr. 20, 2001; available from Xilinx, Inc., 2100 Logic Drive, San Jose, California 95124; pp. 1–25.

* cited by examiner

*Primary Examiner*—Matthew Smith
*Assistant Examiner*—Paul Dinh
(74) *Attorney, Agent, or Firm*—H. C. Chan

(57) ABSTRACT

The present invention provides a new method to handle power and ground signals in modular design of programmable logic devices. During module implementation, the power and ground signals of each module are associated with area constraint properties. When performing routing in the module implementation phase, the power and ground signals together with regular local signals of the module are routed in accordance with their respective area constraint properties. However, the area constraint properties of the power and ground signals are removed during assembly phase while the area constraint properties of the local signals are retained.

12 Claims, 5 Drawing Sheets

SIGNAL ROUTING IN PROGRAMMABLE LOGIC DEVICES

This application is a continuation of U.S. application Ser. No. 10/035,500 filed Oct. 25, 2001 and now U.S. Pat. No. 6,496,970 which is a continuation of 09/916,071 files Jul. 26, 2001 and which is now U.S. Pat. No. 6,480,999.

FIELD OF THE INVENTION

The present invention relates to programmable logic devices (PLDs), and more particularly to a method for routing signals in programmable logic devices.

BACKGROUND OF THE INVENTION

A programmable logic device, such as a field programmable gate array (FPGA), is designed to be user-programmable so that users can implement logic designs of their choices. In a typical architecture, an FPGA includes an array of configurable logic blocks (CLBs) surrounded by programmable input/output blocks (IOBs). The CLBs and IOBs are interconnected by a hierarchy of programmable routing resources. These CLBs, IOBs, and programmable routing resources are customized by loading a configuration bitstream into the FPGA.

When an FPGA comprises thousands of CLBs in large arrays of tiles, the task of establishing the required multitude of interconnections between primitive cells inside a CLB and between the CLBs becomes so onerous that it requires software tool implementation. Accordingly, the manufacturers of FPGAs, including the assignee hereof, Xilinx, Inc., have developed place and route software tools which may be used by their customers to implement their respective designs into the FPGAs of these manufacturers.

The execution of routing software (called herein "router engines") can be very time consuming. A typical design implementation can take many hours of computer time using conventional routing software tools. Many routing methods do not connect resources optimally. This could lead to unnecessary timing delays and power consumption in the final design. Thus, there is a need to improve conventional routing methods.

SUMMARY OF THE INVENTION

The present invention involves a novel application of area constraint for signal routing in a programmable logic device. The method of the present invention can be applied to designs that can be separated into global logic and a number of modules. The signals of the design include at least one global signal and a plurality of local signals. Each local signal is associated with at least one of the modules. The local signals are area constrained. During the module implementation phase of the present invention, an area constraint property is attached to each local signal, while the global signal is not attached to an area constraint property. In one embodiment, power and ground signals are also associated with area constraint properties during this module implementation phase. The global signal is not pre-routed and locked. A router engine routes all the signals in each module under the restrictions of their respective area constraint properties. Thus, the router engine does not commit to a sub-optimal solution. It avoids pre-routing and locking of results early in the routing process.

During the assembly phase, the global logic and the modules are merged into a single design. During this phase, area constraint is removed from the power and ground signals. The modules implemented under the module implementation phase are retrieved. As each module is retrieved, its routing is not considered locked. Instead, the router engine has the freedom to rip-up and re-route the signals. However, the routing performed under module implementation is normally kept unless it leads to conflicts or it contains signals running across other modules. This process allows the router engine to explore alternative allowable routing solutions to better achieve overall optimal solution for the entire design.

The above summary of the present invention is not intended to describe each disclosed embodiment of the present invention. The figures and detailed description that follow provide additional example embodiments and aspects of the present invention.

DETAILED DESCRIPTION OF THE INVENTION

As the number of gates in a PLD becomes larger and larger, it is possible to implement increasingly complex designs into a PLD. It is the experience of many designers that partitioning a single large design into several smaller designs has many benefits. For example, large designs are generally difficult to manage if kept as a single, monolithic entity. By dividing a design into smaller pieces, each piece can be separately understood and implemented. Other advantages are discussed in a Xilinx application note, XAPP 404, entitled "Xilinx Alliance 3.1i Modular Design" and published in June 2000. This publication also contains detailed technical information on conventional modular design methods, and its content is incorporated herein by reference.

Figure 1A:
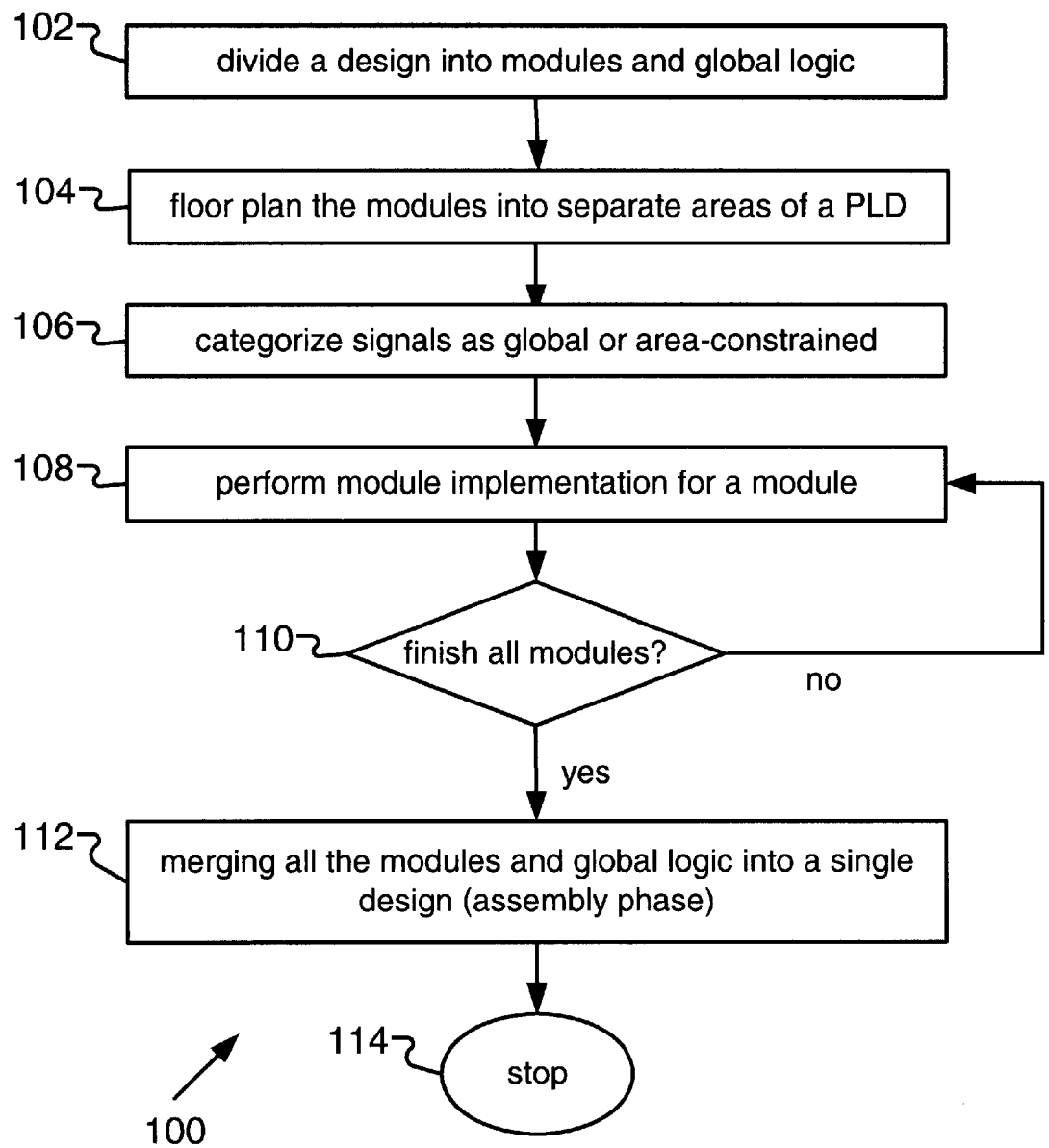
FIG. 1A is a flow chart showing a modular design process of the present invention.
Figure 1B:
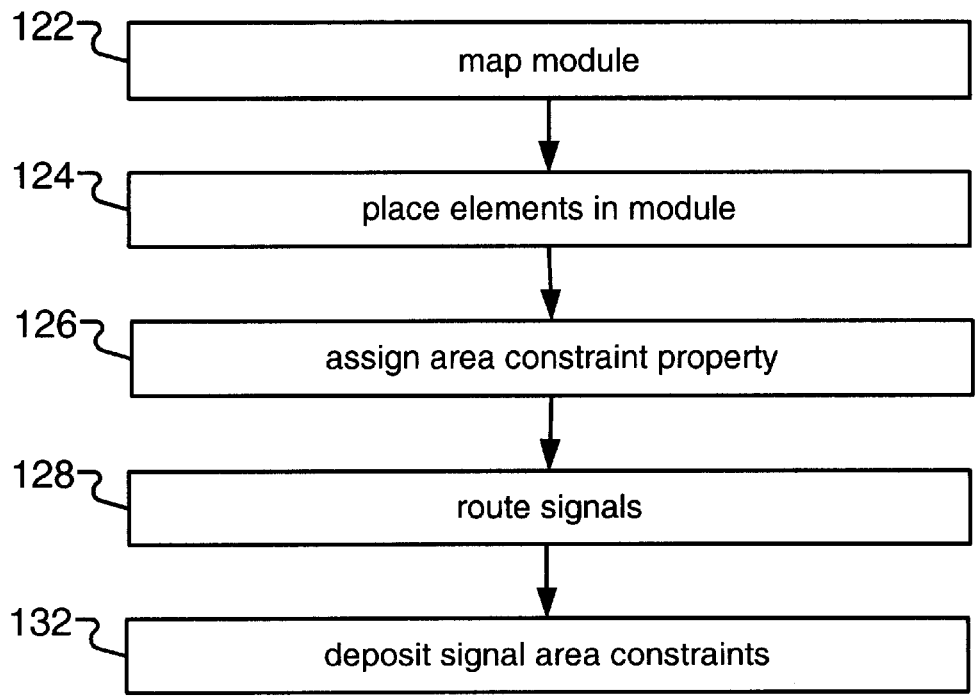
FIG. 1B is a flow chart showing detailed steps of module implementation of the present invention.
Figure 1C:
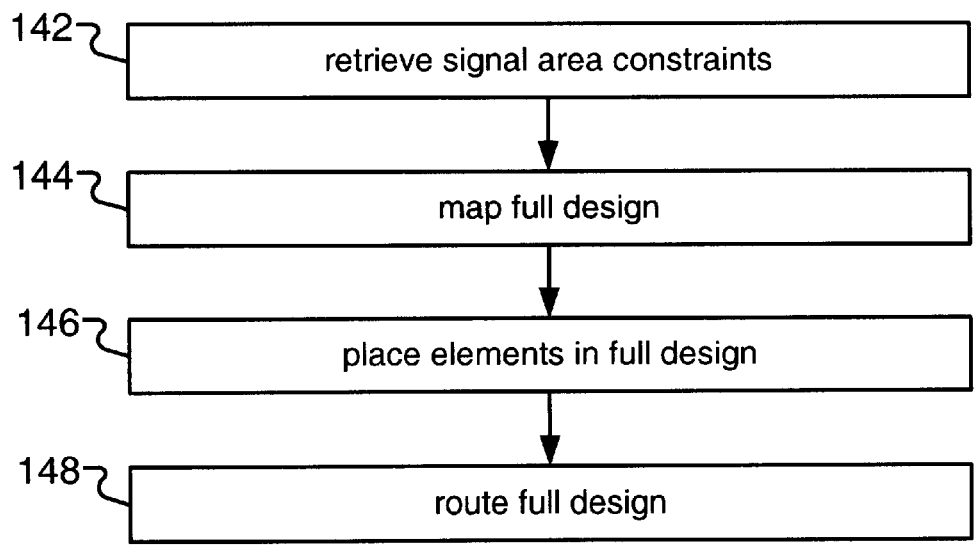
FIG. 1C is a flow chart showing detailed steps of the assembly phase of the present invention.

A new routing paradigm that can improve the performance of router engines used in modular design is disclosed herein. This is illustrated in FIGS. 1A–1C. FIG. 1A is a flow chart showing a modular design process 100 of the present invention. In step 102, a design is divided into a plurality of modules. Some logic elements (called "global logic") are not included in any of the modules. Global logic is defined as logic not evenly distributed on a target chip. Members in this group are top level logic elements that connect different modules. Examples of global logic are I/O pins leading onto or off of the chip, DLLs, or other global clock modification resources. In step 104, each module is floor planned into separate areas. The methods described in the above mentioned publication may be used in steps 102 and 104. In step 106, signals are categorized as either global or area constrained. In the present invention, the treatment of these two types of signals is substantially different from that in conventional methods. Details of the categorization and treatment are described below. In step 108, a module is implemented into its planned area ("module implementation"). In step 110, process 100 determines whether all the modules have been implemented. If not all have been implemented, step 108 is performed again for another module. If all have been implemented, all the modules (implemented under step 108) and global logic are merged into a single design (step 112). This is called the "assembly" phase.

Details of step 108 (module implementation) as applied to each module is further described in FIG. 1B. In step 122, the logic elements of the design associated with a module is assigned to specific physical PLD elements that implement the logic elements (generally referred to as "mapping"). In step 124, a place tool is used to determine the placement of the physical elements inside the module. In step 126, each signal in the module is analyzed using the method of the present invention, and then assigned, if appropriate, an area constraint property (described in more detail below). In the present invention, the signal area constraint property of each signal is used to guide the routing. In step 128, the signals are routed in accordance with the method of the present invention so that the physical elements in the module are connected using routing resources. Additional details of this step will be disclosed below. In step 132, the area constraint property of each signal belonging to the current module is deposited in a predetermined location. Other information, such as those described in the above-described publication, may also be deposited.

Details of step 112 (assembly) are further described in FIG. 1C. In step 142, the deposited area constraint properties of all the signals are retrieved. In step 144, mapping is performed on the full design (including all the modules and global logic). In step 146, the elements in the full design are placed. In step 148, all the signals in the full design are routed using the method of the present invention. Additional details of this step will be disclosed below.

Turning now to the method of categorizing signals (step 106 of FIG. 1A), a signal is considered a global signal if its associated resources and loads span throughout the PLD (i.e., more than two modules). In the present invention, global signals are not associated with area constraint. All other signals are local signals. In the present invention, the local signals are highly area constrained. The sources and loads of the local signals are defined within the physical boundaries of their respective modules. Furthermore, the routing of the local signals must reside within predefined routing areas of their respective modules. In order to convey such information, each local signal has an associated area constraint property. One exception to this categorization is that both power and ground signals are area constrained during module implementation, and each is associated with an area constraint property.

Some examples of global signals are:

(a) a signal that has a global clock buffer source;
(b) a signal that has a block ram source;
(c) a signal that has a boundary scan source;
(d) a signal that has a phased lock loop source;
(e) a signal that has a global clock I/O source;
(f) a signal that has a PCI I/O source;
(g) a signal that has a PCI logic source;
(h) a signal that has a startup source;
(i) a signal that has a I/O source; and
(j) a signal that has 2 or more tri-stateable sources (tri-state bus).

In conventional methods, module implementation is done in two phases. First, all global signals are routed, and the resulting detailed routing are locked. This is done to prevent subsequent signal routing to alter its prior results. Then all local signals are routed within their pre-defined route region of the module. These conventional methods often commit the router engine unnecessarily to a sub-optimal solution early in the routing phase. By routing the global signals early and independent of the local signals, these conventional methods do not take into consideration the effects of the local signals. This could lead to a sub-optimal result. Making matter worse, the router engine in conventional methods cannot reverse its previous decisions and remedy the problem because the routing of the global signals is locked.

During the assembly phase of conventional methods, the previously implemented modules are retrieved and all the module routings are locked. At this point, the router engine is severely handicapped and has little or no flexibility in achieving reasonable levels of routability and delay optimizations. Thus, this further compound the problems introduced at the module implementation phase. Consequently, the final design using conventional methods typically results in excessive run-time and/or poor design routability.

In the approach of the present invention, area constraints are assigned on a per signal basis. During module implementation phase, each signal is analyzed. The local signals are each assigned an area constraint while each global signal is assigned no restraint. The area constraint serves as a resource map and-will guide the signals in its routing. In this approach, no pre-routing of global signals or locking of routing is required. The router engine can consider all signals. Routing both local and global signals in module implementation leads to more flexibility in performing resource and delay optimizations.

To extend this concept to the assembly phase, the area constraint (or lack thereof) of each signal is carried forward from module implementation to final assembly. As each module is retrieved, its routing is no longer considered locked. Instead, the router engine has the freedom to rip-up and re-route as needed (while under the restrictions placed by area constraint). As a result, the router engine can explore alternative allowable routing solutions to better achieve an overall optimal solution for the entire design.

Figure 2A:
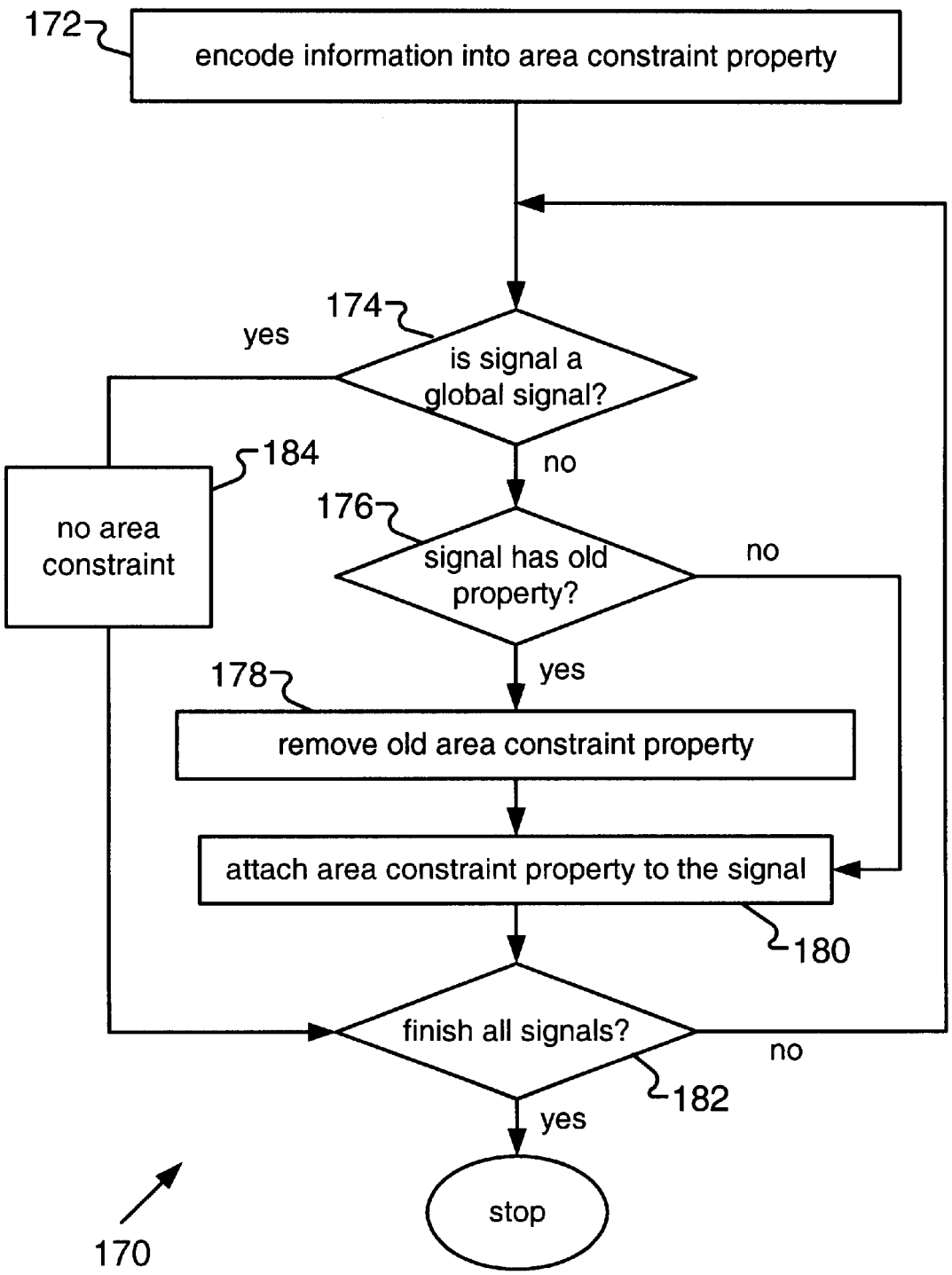
FIG. 2A is a flow chart showing the detailed steps of area constraint property assignment in accordance with the present invention.

The detailed process 170 of assigning area constraint property (i.e., step 126 of FIG. 1B) is shown in FIG. 2A. One aspect of the present invention is that each local signal in a module may have a different routing area. This is different from conventional modular implementation in which all local signals in a module have the same routing area. One advantage is that this method provides more flexibility in routing. The routing area of a local signal is determined by external sources (such as input from users of the present method).

Two pieces of information are found to be very important for routing local signals in accordance with the present invention. The first piece of information is a pair of coordinates defining a "bounding box", which is the routing area of the signal. The second piece of information is whether the local signal is allowed to use routing resources that cross the bounding box.

In step 172 of FIG. 2A, information of each local signal is encoded into its associated area constraint property. In one embodiment, data encoded into an area constraint property includes (a) version number of data encoded, which is used to verify data and control revisions, (b) name of the area constraint, (c) two (x,y) coordinates, and (d) an attribute describing if the signal is allowed to use routing resources that cross a routing area defined by the (x,y) coordinates. The (x,y) coordinates are the bounding box coordinates (e.g., lower left and upper right) of the routing area of the signal. These pieces of data may be encoded in any convenient format because the format is not important for implementing the present invention.

The signals in a module are considered one by one. In step 174, process 170 determines whether a signal under consideration is a global signal. If it is, the signal is not assigned an area constraint property (step 184), and another signal is considered. If it is not, process 170 determines whether the signal is associated with an old area constraint property, e.g., based on a previous routing operation (step 176). If the signal is associated with an old area constraint property, the old area constraint property is removed (step 178). A new area constraint property (generated by step 172) is attached to the signal (step 180). If it is determined (under step 176) that the signal is not associated with an old area constraint property, then there is no need to perform step 178, and a new area constraint property is attached to the signal. Process 170 then determines whether all the signals associated with a module have been considered (step 182). If all the signals have been considered, process 170 terminates. Otherwise, the loop will be repeated.

In process 170, power and grounds signals are not considered global signals, and are assigned area constraints under the present invention.

Figure 2B:
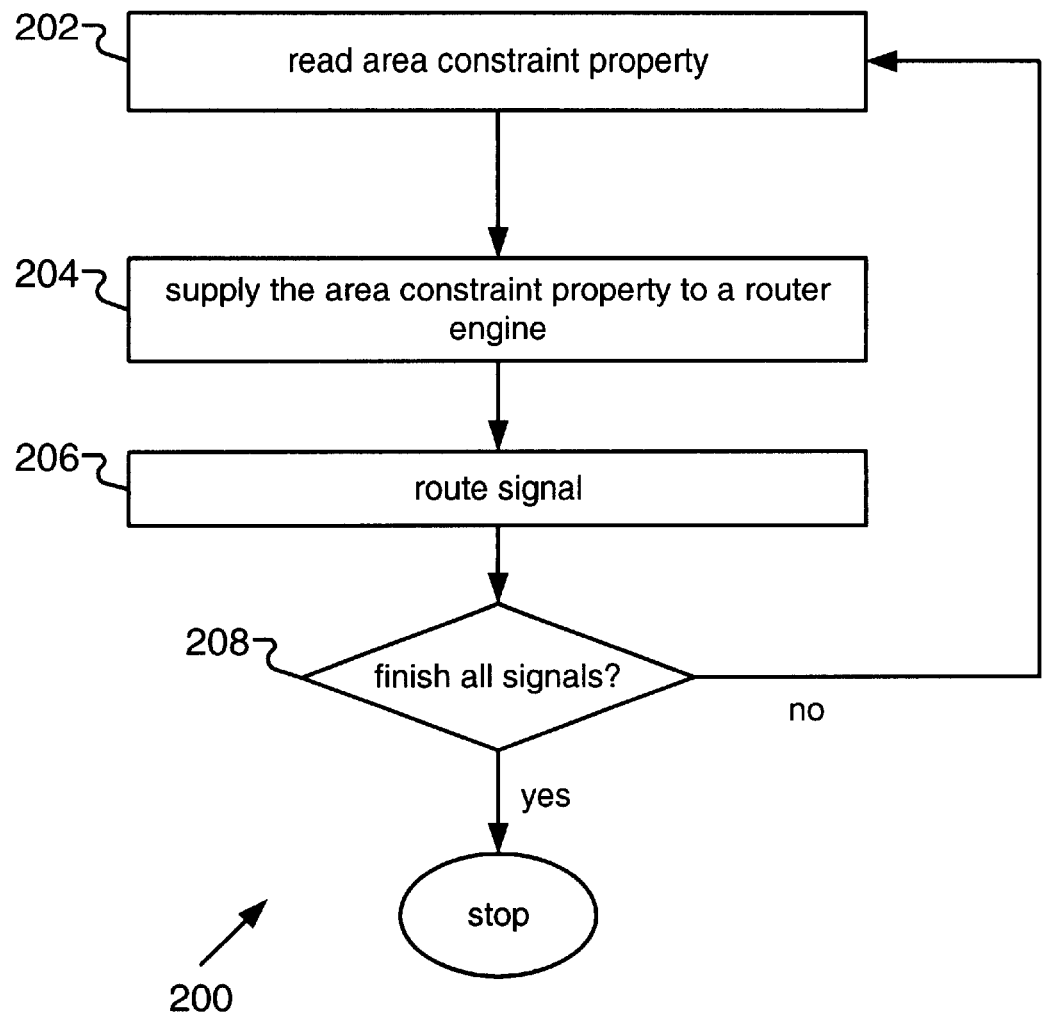
FIG. 2B is a flow chart showing the detailed steps of signal routing in the module implementation phase of the present invention.

The detailed process 200 of route signals in the module implementation phase. (i.e., step 128 of FIG. 1B) is shown in FIG. 2B. In step 202, the area constraint property attached with a signal is read. Some signals (e.g., global signals) may not have any area constraint. In step 204, this area constraint property is supplied to a router engine. In step 206, the router engine routes the signal in accordance with the restrictions in the area constraint property. In step 208, process 200 determines whether all the signals in the module have been routed. If all the signals have been routed, process 200 terminates. Otherwise, the loop will be repeated.

Figure 3:
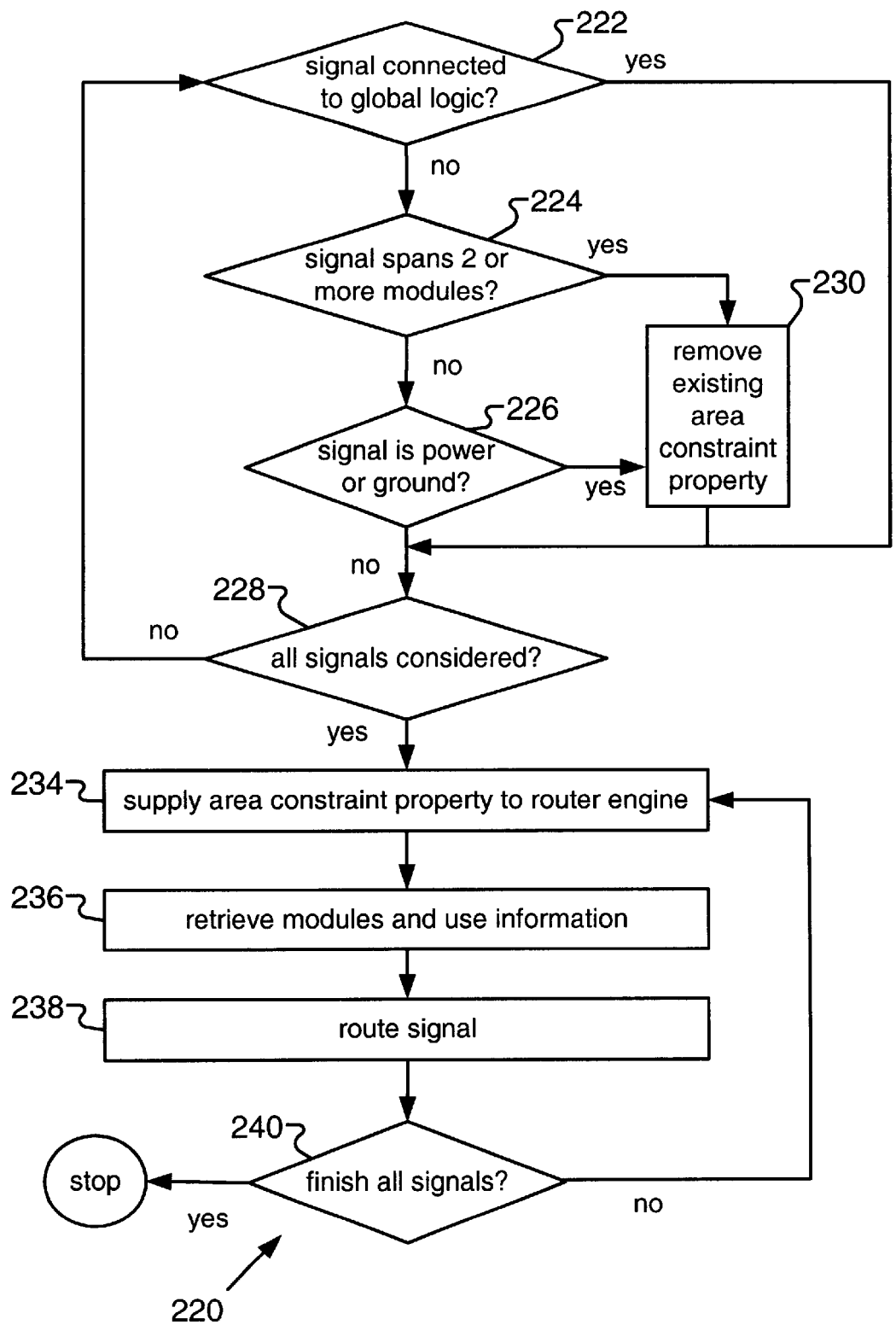
FIG. 3 is a flow chart showing the detailed steps of routing in the assembly phase of the present invention.

A process 220 of routing the full design (i.e., step 148 of FIG. 1C) is shown in FIG. 3. The first phase of operations is to properly handle the area constraint property of the signals. In step 222, process 220 determines whether the signal under consideration belongs to global logic. If it belongs to global logic, it is not associates with an area constraint property. Thus, process 220 can proceed with other signals (step 228). If it does not belong to global logic, process 220 determines whether the signal spans two or more modules (step 224). If it does, the existing area constraint property is also removed (step 230). If it does not, process 220 determines whether the signal is a power or a ground signal (step 226). If it is either a power or ground signal, the existing area constraint property is removed (step 230). If it is not, the area constraint property assigned using the method of the present invention remains with the signal. This phase of the operation for one signal is completed. Process 220 determines whether all the signals have been considered (step 228). If not all the signals in the full design have been considered, the next signal will be considered by looping back to step 222. When all the signals have been considered, the second phase begins.

In step 234, the area constraint property of the first phase is supplied to a router engine (which can be the same engine as the one used in process 200 of FIG. 2B). In step 236, the modules routed using module implementation is retrieved. The routing information developed under module implementation is used in the assembly phase. If the signals in a module are not in conflict with the global signals or signals in other modules, the routing under module implementation does not need to be changed. In step 238, the router engine routes all the signals using information under module implementation and taking into account of the restrictions based on the area constraint properties. Process 220 determines whether all the signals have been routed (step 240). If not all have been routed, process 220 loops back to step 234. If all have been routed, process 220 stops.

It can be seen from the above description that a novel routing method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A method for routing a plurality of signals of a design in a programmable logic device, said programmable logic device being divided into a plurality of non-overlapping areas, said design containing at least one global signal, at least one power signal, at least one ground signal and a plurality of local signals, each of said local signals being related to one of said plurality of areas, said method comprising:

associating a respective area constraint property to each of said power signal, said ground signal and said plurality of local signals, said area constraint property containing routing information related to one of said plurality of areas;

performing a first routing of said plurality of local signals and said global signal, each of said plurality of local signals being constrained by its associated area constraint property, said global signal not being constrained to one of said plurality of areas; and performing a second routing of said plurality of local signals and said global signal, said second routing including, for each of said plurality of local signals that spans more than one of said plurality of areas, removing its associated area constraint property.

2. The method of claim 1 wherein said programmable logic device is a field programmable gate array.

3. The method of claim 1 wherein at least some of said plurality of areas have different sizes.

4. The method of claim 1 wherein at least some of said plurality of areas are defined by two coordinates.

5. The method of claim 1 wherein said step of performing said second routing further comprises a step of removing area constraint property from said power and said ground signals.

6. The method of claim 5 wherein said programmable logic device is a field programmable gate array.

7. The method of claim 5 wherein at least some of said plurality of areas have different sizes.

8. The method of claim 5 wherein at least some of said plurality of areas are defined by two coordinates.

9. A method for routing a plurality of signals of a design in a programmable logic device, said programmable logic device being divided into a plurality of non-overlapping areas, said design containing at least one global signal and a plurality of local signals, each of said local signals being related to one of said plurality of areas, said method comprising:

encoding a plurality of area constraint properties, each of said plurality of properties containing area information and an attribute describing if its associated local signal is allowed to use routing resources that cross area boundary;

for each one of said plurality of signals:
associating a respective area constraint property to said each signal if said each one is a local signal;
associating a respective area constraint property to said each signal if said each one is a power signal; and
associating a respective area constraint property to said each signal if said each one is a ground signal;

performing a first routing of said plurality of signals;

for said each one of said plurality of signals;
removing said respective area constraint property if said each one is said power signal; and
removing said respective area constraint property if said each one is said ground signal, and performing a second routing of said plurality of signals after said removing steps.

10. The method of claim 9 wherein said programmable logic device is a field programmable gate array.

11. The method of claim 9 wherein at least some of said plurality of areas have different sizes.

12. The method of claim 9 wherein at least some of said plurality of areas are defined by two coordinates.

* * * * *